(12) United States Patent
Nonis et al.

(10) Patent No.: US 8,742,858 B2
(45) Date of Patent: Jun. 3, 2014

(54) RELAXATION OSCILLATOR HAVING A SUPPLY VOLTAGE INDEPENDENT OUTPUT FREQUENCY

(75) Inventors: Roberto Nonis, Warmbad-Villach (AT); Nicola DaDalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/016,761

(22) Filed: Jan. 28, 2011

(65) Prior Publication Data

US 2012/0194279 A1 Aug. 2, 2012

(51) Int. Cl.
*H03K 4/501* (2006.01)
*H03K 3/011* (2006.01)
*H03K 3/0231* (2006.01)

(52) U.S. Cl.
CPC .............. *H03K 3/011* (2013.01); *H03K 3/0231* (2013.01); *H03K 4/501* (2013.01)
USPC .............. 331/111; 331/143; 331/185; 331/44

(58) Field of Classification Search
USPC ............................ 331/111, 143, 44, 175, 176
See application file for complete search history.

(56) References Cited

U.S. PATENT DOCUMENTS

| | | | | | |
|---|---|---|---|---|---|
| 5,699,024 | A | * | 12/1997 | Manlove et al. | 331/111 |
| 6,020,792 | A | * | 2/2000 | Nolan et al. | 331/111 |
| 7,034,627 | B1 | * | 4/2006 | Kudari | 331/143 |
| 7,432,771 | B2 | * | 10/2008 | Chui | 331/144 |
| 7,486,151 | B2 | * | 2/2009 | Goudo | 331/143 |

* cited by examiner

*Primary Examiner* — Ryan Johnson
(74) *Attorney, Agent, or Firm* — SpryIP, LLC (57) ABSTRACT

Techniques and architectures corresponding to relaxation oscillators having output frequencies that are supply voltage independent are described. In a particular embodiment, an apparatus includes a relaxation oscillator having one or more capacitors and a compensation current circuit coupled to the relaxation oscillator. The compensation current circuit is configured to regulate current provided to the one or more capacitors of the relaxation oscillator in response to changes in a supply voltage provided to the compensation current circuit and to the relaxation oscillator.

14 Claims, 5 Drawing Sheets

RELAXATION OSCILLATOR HAVING A SUPPLY VOLTAGE INDEPENDENT OUTPUT FREQUENCY

BACKGROUND

Relaxation oscillators provide output signals at a particular frequency, often on the order of kilohertz or megahertz. Many relaxation oscillators provide output signals by dissipating energy stored in the relaxation oscillators, such as energy stored in one or more capacitors. For a number of applications, relaxation oscillators having a constant or nearly constant output frequency is desired.

The output frequency of a relaxation oscillator may depend on an amount of time for the relaxation oscillator to store a specified amount of energy, such as an amount of time to charge one or more capacitors of the relaxation oscillator. The output frequency of the relaxation oscillator may also depend on the delay associated with the operation of other components of the relaxation oscillator, such as the delay associated with the operation of one or more comparators, one or more flip-flops, and so on.

Certain relaxation oscillators attempt to achieve a constant output frequency by providing a constant current to store energy in the relaxation oscillators in order to achieve a constant time needed to charge the relaxation oscillator. Additionally, many relaxation oscillators attempt to provide a constant output frequency by minimizing the delay associated with the operation of the other components of the relaxation oscillator. However, even when the time to store energy in the relaxation oscillator is constant or nearly constant, the delay associated with the operation of components of the relaxation oscillator can still cause unacceptable changes in the output frequency, especially as the output frequency increases and the supply voltage varies. Furthermore, many relaxation oscillators utilize expensive and technologically advanced components in an attempt to minimize the delay of these components, but these components often increase power consumption associated with the relaxation oscillator.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

This disclosure describes an apparatus including a relaxation oscillator having one or more capacitors and a compensation current circuit coupled to the relaxation oscillator. The compensation current circuit is configured to regulate current provided to the one or more capacitors of the relaxation oscillator in response to changes in a supply voltage provided to the compensation current circuit and to the relaxation oscillator. In particular, the compensation current circuit modifies the current provided to charge the one or more capacitors in order to change the time taken to charge these devices. Thus, as variations in the supply voltage affect the delay associated with other components of the relaxation oscillator, the compensation current circuit causes an amount of current to be provided to the one or more capacitors to charge the capacitors in an amount of time that offsets the changes in the delay associated with the other components. In this way, the relaxation oscillator can provide output signals at a constant or nearly constant frequency. In particular embodiments, the compensation current circuit may include a current mirror arrangement having a pair of metal oxide semiconductor (MOS) transistors.

Figure 1:
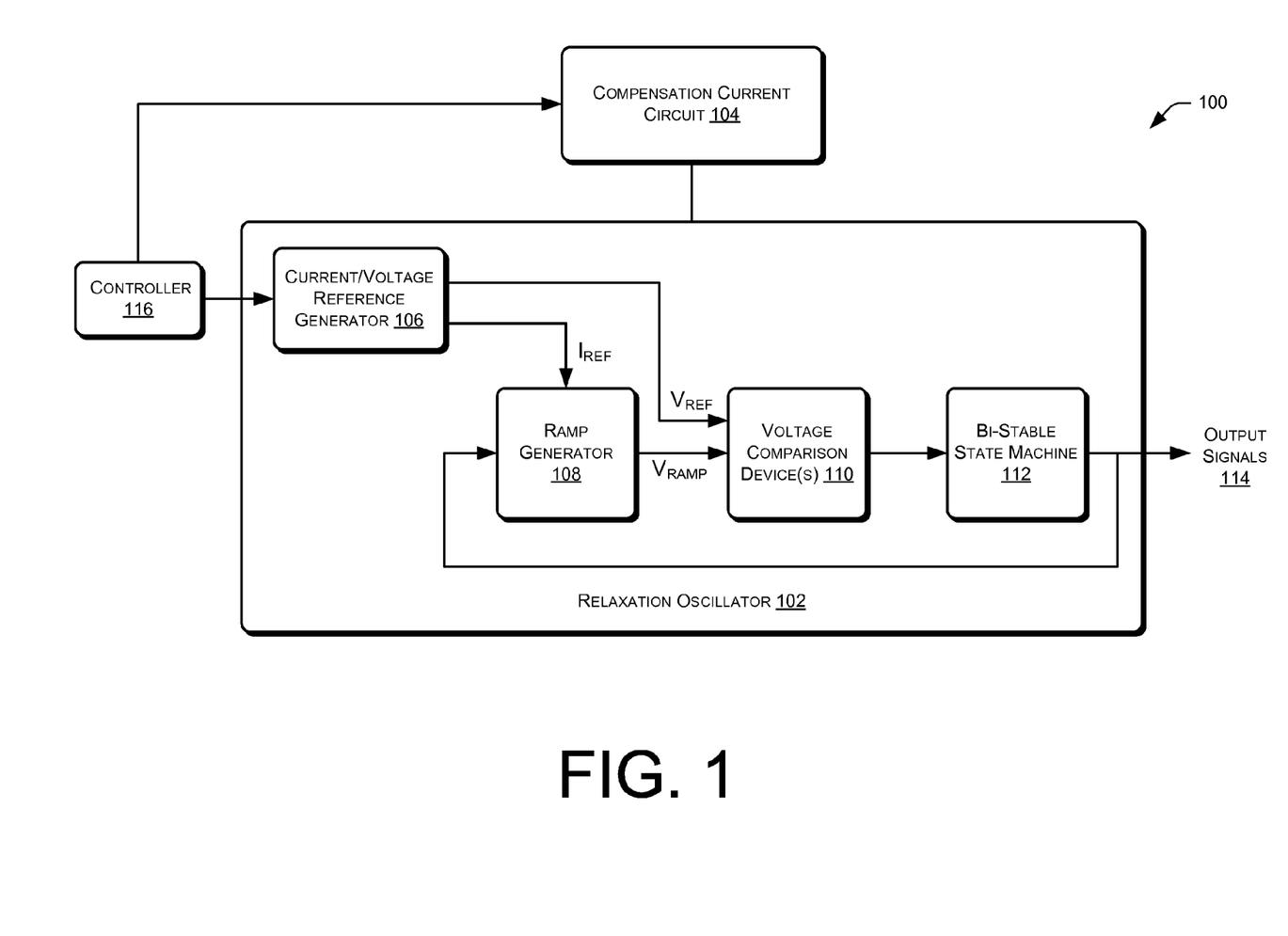
FIG. 1 is a schematic diagram of a system including a relaxation oscillator coupled to a compensation current circuit that modifies current utilized to produce oscillations of the relaxation oscillator.

FIG. 1 is a schematic diagram of a system 100 including a relaxation oscillator 102 coupled to a compensation current circuit 104 that modifies current utilized to produce oscillations of the relaxation oscillator 102. The relaxation oscillator 102 includes a current/voltage reference generator 106 to provide a reference current, $I_{REF}$, and a reference voltage, $V_{REF}$. The relaxation oscillator 102 also includes a ramp generator 108. The ramp generator 108 may include one or more energy storage devices, such as one or more capacitors. The one or more energy storage devices of the ramp generator 108 may be charged by a current derived from the reference current. For example, a current source of the ramp generator 108 may receive $I_{REF}$ and utilize $I_{REF}$ to provide a charging current to at least one energy storage device of the ramp generator 108. When a respective energy storage device of the ramp generator 108 is being charged, the respective energy storage device may produce a voltage labeled as $V_{RAMP}$ in FIG. 1. In some situations, $V_{RAMP}$ may be produced by more than one energy storage device of the ramp generator 108.

Additionally, the relaxation oscillator 102 includes one or more voltage comparison devices 110, such as one or more comparators, coupled to devices of the ramp generator 108. The one or more voltage comparison devices 110 may compare a voltage of the ramp generator 108, $V_{RAMP}$, with a reference voltage, $V_{REF}$. When $V_{RAMP}$ reaches $V_{REF}$, at least one voltage comparison device 110 may provide a signal to a bi-stable state machine 112 coupled to the voltage comparison devices 110. In some embodiments, the bi-stable state machine 112 may include one or more set/reset flip-flops. When the bi-stable state machine 112 receives a signal from the voltage comparison devices 110, the bi-stable state machine 112 may change state and produce one or more output signals 114. The bi-stable state machine 112 may also provide feedback to the ramp generator 108 to control the charging and discharging of energy storage devices of the ramp generator 108.

The frequency of the output signals 114 may depend on an amount of time before the voltage $V_{RAMP}$ reaches the threshold voltage $V_{REF}$. In addition, the frequency of the output signals 114 may depend on delays associated with the operation of the voltage comparison devices 110 and the operation of the bi-stable state machine 112. In some cases, the delays associated with the operation of the voltage comparison devices 110 and the bi-stable state machine 112 may depend on variations in a supply voltage provided to the relaxation oscillator 102. For example, when the supply voltage increases, the speed of operation of the voltage comparison devices 110 and/or the bi-stable state machine 112 may increase. Consequently, the delay associated with the operation of the voltage comparison devices 110 and the bi-stable state machine 112 may decrease. Thus, the frequency of the output signals 114 may change when the supply voltage provided to the relaxation oscillator 102 changes. Conversely, when the supply voltage decreases and operation of the voltage comparison devices 110 and/or the bi-stable state machine 112 slows down, the delays associated with the voltage comparison devices 110 and/or the bi-stable state machine 112 may increase and thereby affect the frequency of the output signals 114.

The compensation current circuit 104 may operate to reduce or eliminate variations in the frequency of the output signals 114 due to changes in supply voltage. In an illustrative embodiment, the compensation current circuit 104 may modify the current provided to charge the energy storage devices of the ramp generator 108 to reduce or eliminate variations in the frequency of the output signals 114, rather than attempting to minimize the delay of the voltage comparison devices 110 and the bi-stable state machine 112. For example, as the supply voltage increases and the delay associated with the voltage comparison devices 110 and/or the bi-stable state machine 112 decreases, the compensation current circuit 104 may decrease the current provided to the energy storage devices of the ramp generator 108. Thus, the energy storage devices of the ramp generator 108 will take longer to charge to make up for the increased speed of operation of the voltage comparison devices 110 and/or the bi-stable state machine 112. In another example, when the supply voltage decreases, the compensation current circuit 104 may increase the current provided to the energy storage devices of the ramp generator 108 in order to compensate for a decreased speed of operation of the voltage comparison devices 110 and/or the bi-stable state machine 112. By modifying the current provided to the energy storage devices of the ramp generator 108 based on supply voltage variations, the total amount of time for the ramp generator 108, the voltage comparison devices 110, and the bi-stable state machine 112 to operate is constant or nearly constant and the frequency of the output signals 114 is also constant or nearly constant.

The system 100 also includes one or more controllers represented by controller 116 that provides control signals to the current/voltage reference generator 106 and the compensation current circuit 104. The controller 116 may include or be coupled to a microprocessor. In a particular embodiment, the controller 116 may provide control signals to the current/voltage reference generator 106 to produce $I_{REF}$ and $V_{REF}$ having particular values. The values of $I_{REF}$ and $V_{REF}$ may be determined based on a frequency calibration performed with respect to the relaxation oscillator 102. In a particular embodiment, the values of $I_{REF}$ and $V_{REF}$ may produce a constant or nearly constant frequency of the output signals 114 for the technology corner of the relaxation oscillator 102. The technology corner of the relaxation oscillator 102 may refer to operational characteristics of the relaxation oscillator 102 based on variations in the process utilized to manufacture the relaxation oscillator 102. To illustrate, additional relaxation oscillators manufactured on the same wafer, or on different wafers of the same wafer lot, or on different wafer lots, as the relaxation oscillator 102 may operate at different speeds or have other differences in their operational characteristics based on process variations that occur during the manufacture of the relaxation oscillators on the wafer.

Additionally, the controller 116 may provide control signals to the compensation current circuit 104 to control modifications to the current provided to the energy storage devices of the ramp generator 108 based on changes in the supply voltage. The extent of the modifications to the current provided to the energy storage devices of the ramp generator 108 may be determined via a supply voltage dependence calibration of the compensation current circuit 104. The supply voltage dependence calibration may determine an amount of change of the current provided to the energy storage devices of the ramp generator 108 based on corresponding changes in supply voltage in order to provide constant or nearly constant frequency of the output signals 114.

The relaxation oscillator 102 may be utilized in a number of applications, such as lighting applications, automotive applications, and so on. In many applications, the relaxation oscillator 102 may consume low amounts of power, even though the relaxation oscillator 102 is powered continually. In some cases, the relaxation oscillator 102 may provide wake-up signals to components of a vehicle. In an illustrative implementation, certain components of a vehicle may be in an inactive state when not in operation in order to conserve power. For example, components of a vehicle door, such as power windows and power locks, may be inactive until controls associated with these components are operated by a user. In response to operation of controls associated with the power windows or power locks, a controller of the vehicle may send a wake-up sequence to the relaxation oscillator 102, which provides the output signals 114 to activate one or more of the vehicle door components.

Although the operation of the relaxation oscillator 102 has been described in embodiments relating to charging the energy storage devices of the ramp generator 108, other embodiments may be directed to discharging energy stored in energy storage devices of the relaxation oscillator 102 in order to produce oscillating output signals. Thus, the compensation current circuit 104 can operate with respect to changes in a positive supply voltage and/or changes in a negative supply voltage.

Figure 2:
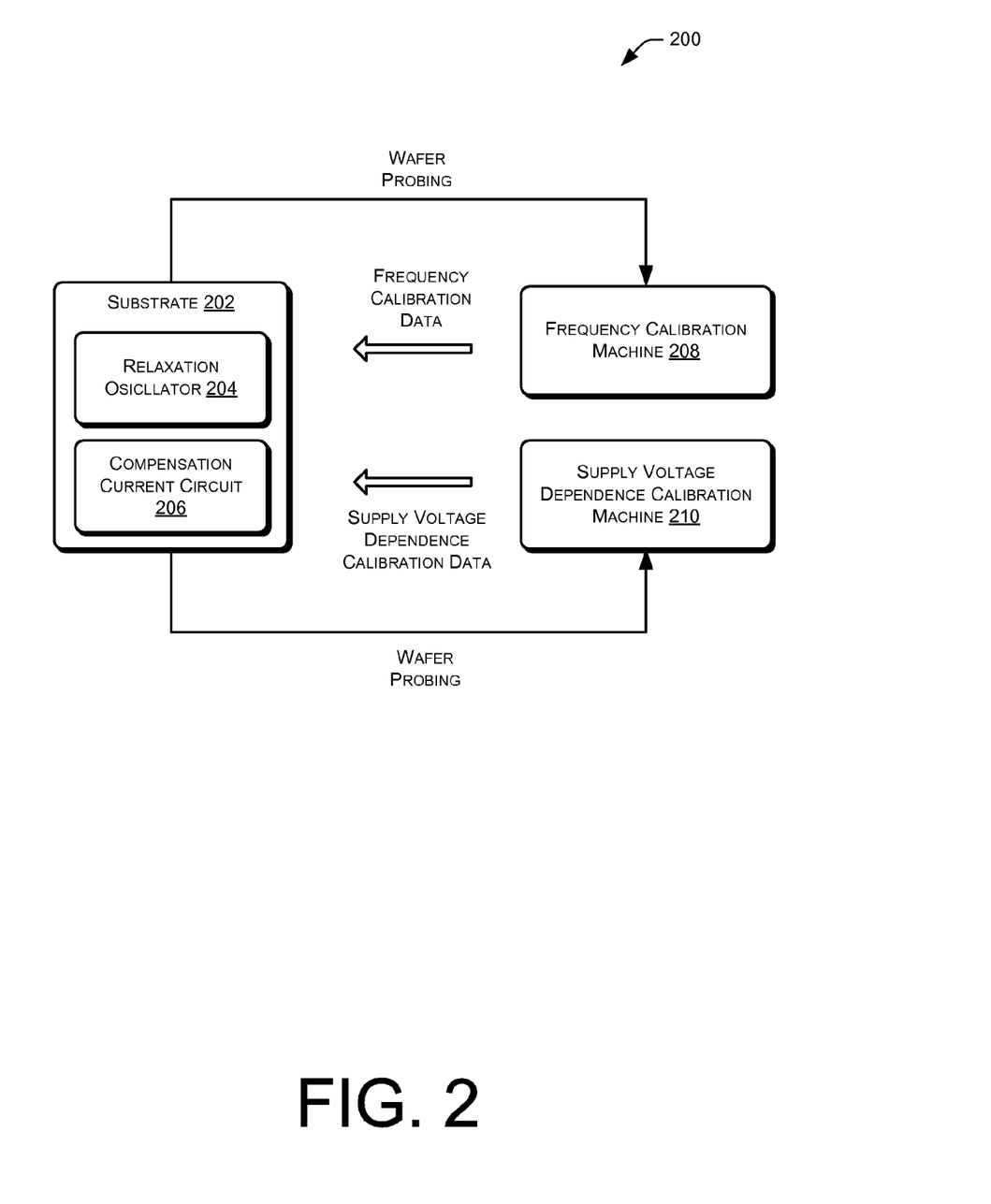
FIG. 2 is a diagram showing frequency calibration of a relaxation oscillator and supply voltage dependence calibration of a compensation current circuit coupled to the relaxation oscillator.

FIG. 2 is a diagram showing frequency calibration of a relaxation oscillator and supply voltage dependence calibration of a compensation current circuit coupled to the relaxation oscillator. In the particular embodiment shown in FIG. 2, wafer probing is conducted with respect to a substrate 202. The substrate 202 includes a relaxation oscillator 204 and a compensation current circuit 206 that is coupled to the relaxation oscillator 204. The substrate 202 may also include additional relaxation oscillators and their corresponding compensation current circuits.

In an illustrative implementation, the substrate 202 may be connected to a frequency calibration machine 208. The frequency calibration machine 208 may perform a frequency calibration with respect to the relaxation oscillator 204. The frequency calibration machine 208 may generate frequency calibration data that is stored with respect to a frequency calibration of the relaxation oscillator 204. In particular, the frequency calibration may identify a frequency control value that is utilized to generate particular reference currents and reference voltages to apply to components of the relaxation oscillator 204 in order to consistently provide output signals at one or more target frequencies.

The frequency control value may be based on a technology corner of the relaxation oscillator 204. The technology corner of the relaxation oscillator 204 may be different from the technology corners of other relaxation oscillators included on the substrate 202 due to process variations in the manufacturing of the relaxation oscillators on the substrate 202. Thus, different frequency control values may be determined for different relaxation oscillators on the substrate 204 in order to provide the same target frequency due to the different technology corners associated with the relaxation oscillators of the substrate 202. In some cases, the one or more target frequencies of the relaxation oscillator 204 may depend on the application of the relaxation oscillator 204.

After frequency calibration of the relaxation oscillator 204, the output frequency of the relaxation oscillator 204 may still be subject to unacceptable variations due to certain operational conditions, such as supply voltage changes. Thus, the substrate 202 may also be connected to a supply voltage dependence calibration machine 210 to perform a supply voltage dependence calibration with respect to the compensation current circuit 206. The supply voltage dependence calibration machine 208 may generate supply voltage dependence calibration data that is stored with respect to a supply voltage dependence calibration of the compensation current circuit 206. In particular, the supply voltage dependence calibration may determine a compensation control value that is utilized to modify current provided to charge energy storage devices of the relaxation oscillator 204 based on corresponding changes to a supply voltage provided to the relaxation oscillator 204. To illustrate, the current provided to the energy storage devices of the relaxation oscillator 204 may be modified based on a compensation current generated by the compensation current circuit 206.

In order to determine the compensation control value for the compensation current circuit 206, the supply voltage dependence calibration machine 210 may measure the output frequency of the relaxation oscillator 204 at a maximum supply voltage and at a minimum supply voltage without providing any compensation current. The supply voltage dependence calibration machine 210 may then provide a compensation current having a specified value and measure the output frequency of the relaxation oscillator 204 at the maximum supply voltage and the minimum supply voltage. If the output frequency for the maximum and minimum supply voltages is different, then the supply voltage dependence calibration machine 210 may perform an iterative process to change the compensation current provided to the relaxation oscillator 204 until the output frequency of the relaxation oscillator 204 is the same or within a specified range for both the maximum supply voltage and the minimum supply voltage. Different compensation control values may be determined for different compensation current circuits on the substrate 202 based on differing frequency control values for the respective relaxation oscillators coupled to the compensation current circuits.

The frequency calibration data and the supply voltage dependence calibration data may include digital data that is stored in one or more data storage devices, such as one or more fuses, one or more registers, and the like, that are accessible to the relaxation oscillator 204, the compensation current circuit 206, and/or a controller providing control signals to the relaxation oscillator 204 and the compensation current circuit 206. The frequency calibration data and the supply voltage dependence data may also be stored in a computer memory storage device in order to be accessible for quality control purposes by the manufacturer of the relaxation oscillator 204 and the compensation current circuit 206. Further, although the frequency calibration machine 208 and the supply voltage dependence calibration machine 210 are shown in FIG. 2 as two separate machines, the frequency calibration machine 208 and the supply voltage dependence calibration machine 210 may be implemented as a single apparatus.

Figure 3:
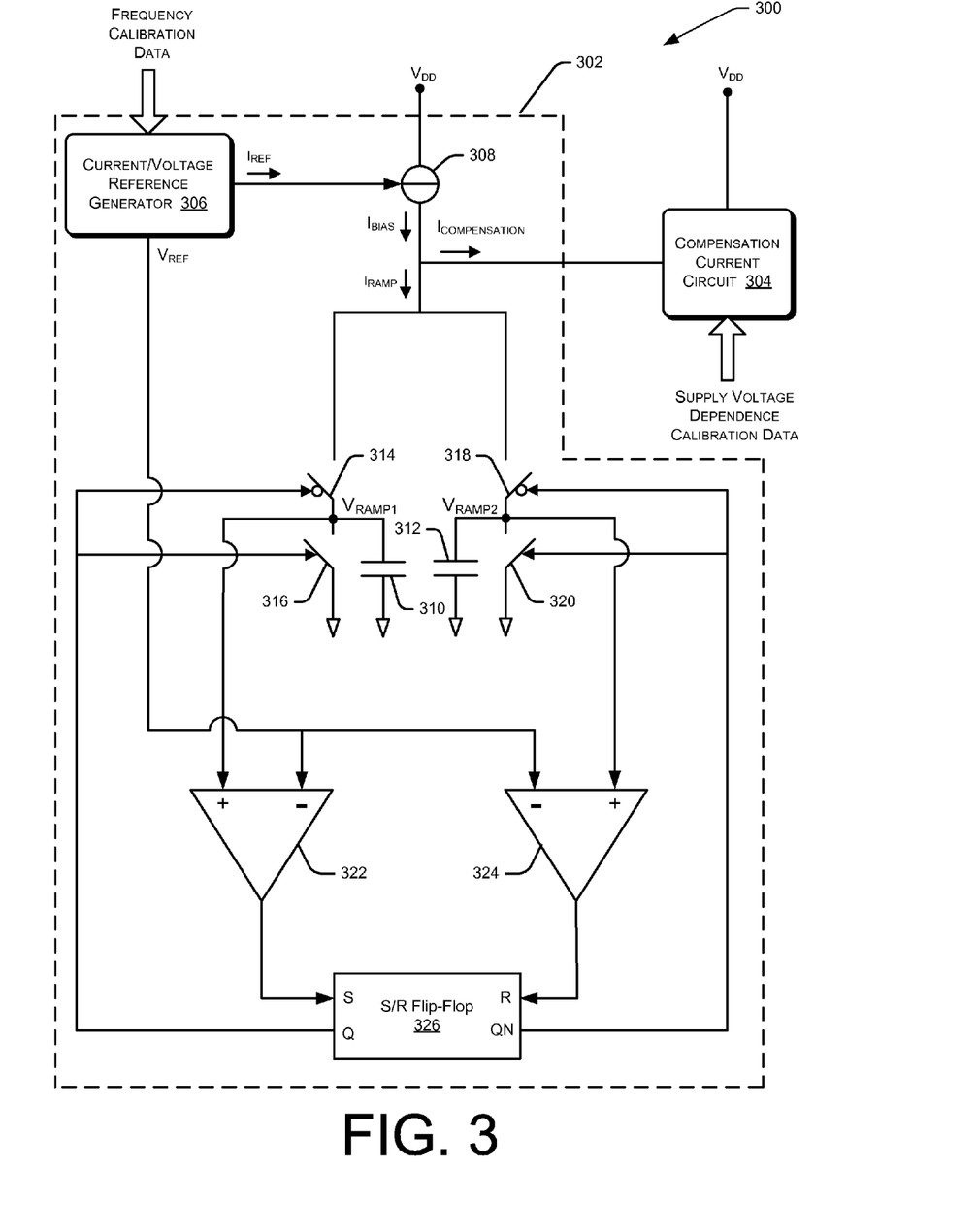
FIG. 3 is a schematic diagram of a system including a particular embodiment of a relaxation oscillator coupled to a compensation current circuit.

FIG. 3 is a schematic diagram of a system 300 including a particular embodiment of a relaxation oscillator 302 coupled to a compensation current circuit 304. The relaxation oscillator 302 includes a current/voltage reference generator 306 to provide a reference current, $I_{REF}$, and a reference voltage $V_{REF}$. The reference current $I_{REF}$ and the reference voltage $V_{REF}$ may be generated based on frequency calibration data provided to the current/voltage reference generator 306. The frequency calibration data may be retrieved from one or more fuses coupled to the relaxation oscillator 302, provided by a controller coupled to the relaxation oscillator 302, and the like.

The relaxation oscillator 302 also includes a current source 308 that is coupled to a source of a positive supply voltage $V_{DD}$ and is coupled to the current/voltage reference generator 306. The current source 308 may receive the current $I_{REF}$ from the current/voltage reference generator 306. The current source 308 may utilize $I_{REF}$ to generate a current $I_{BIAS}$ that may comprise a least a portion of the current provided to charge capacitors 310, 312 of the relaxation oscillator 302. In some cases, the current $I_{BIAS}$ may be modified by the current $I_{COMPENSATION}$ to produce a current $I_{RAMP}$ that is used to charge the capacitors 310, 312. The current $I_{RAMP}$ is also referred to herein as a "ramp current."

The current $I_{COMPENSATION}$ is provided by the compensation current circuit 304. In certain situations, $I_{COMPENSATION}$ is added to $I_{BIAS}$, while in other instances $I_{COMPENSATION}$ is removed from $I_{BIAS}$. The compensation current circuit 304 may generate $I_{COMPENSATION}$ based on changes to the supply voltage $V_{DD}$. The compensation current circuit 304 may also generate $I_{COMPENSATION}$ based on supply voltage dependence calibration data retrieved from one or more fuses coupled to the compensation current circuit 304, supply voltage dependence calibration data provided by a controller, etc.

The capacitor 310 is coupled to switches 314, 316 and the capacitor 312 is coupled to switches 318, 320. The switches 314-320 may operate to charge and discharge the capacitors 310, 312. In addition, the capacitor 310 is coupled to a comparator 322 and the capacitor 312 is coupled to a comparator 324. The inverting inputs of the comparators 322, 324 may have a voltage $V_{REF}$ provided via the current/voltage reference generator 306. Further, the non-inverting input of the comparator 322 may have a voltage of the capacitor 310 $V_{RAMP1}$ and the non-inverting input of the comparator 324 may have a voltage of the capacitor 312 $V_{RAMP2}$.

The comparators 322, 324 may provide signals to a set/reset flip-flop 326. In particular, when the capacitor 310 is charging, the comparator 322 may compare the voltage of the capacitor 310 $V_{RAMP1}$ with $V_{REF}$. When $V_{RAMP1}$ reaches $V_{REF}$, the comparator 322 may provide a signal to the set/reset flip-flop 326 that changes the state of the set/reset flip-flop 326. When the set/reset flip-flop 326 changes state, the set/reset flip-flop 326 may provide an output signal. Additionally, the set/reset flip-flop 326 may provide signals to the switches 314, 316 to open in order to discharge the capacitor 310 and provide signals to the switches 318, 320 to close in order to charge the capacitor 312. In a similar manner, when the capacitor 312 is charging, the comparator 324 may provide a signal to change the state of the set/reset flip-flop 326 when the voltage of the capacitor 312 $V_{RAMP2}$ reaches $V_{REF}$. The set/reset flip-flop 326 may then provide an additional output signal and provide signals to open the switches 318, 320 in order to discharge the capacitor 312 and to close the switches 314, 316 in order to charge the capacitor 310.

In an illustrative embodiment, the frequency of the output signals of the relaxation oscillator 302 depends on the time to charge either the capacitor 310 or the capacitor 312, a delay associated with the operation of the comparator 322 or the comparator 324, and a delay associated with the operation of the set/reset flip-flop 326. When the supply voltage $V_{DD}$ changes, the compensation current circuit 304 may produce the current $I_{COMPENSATION}$ in order to offset changes to the delay associated with the comparators 322 or 324 and/or the delay of the set/reset flip-flop 326. For example, when $V_{DD}$ increases, the delay of the comparator 322 or 324 and the set/reset flip-flop 326 may decrease, thus increasing the frequency of the output signals of the relaxation oscillator 302. Consequently, the compensation current circuit 304 may generate $I_{COMPENSATION}$ such that the current $I_{BIAS}$ is reduced and a value of $I_{RAMP}$ provided to the capacitor 310 or 312 is less than a previous value of $I_{RAMP}$. In this way, the time to charge the capacitor 310 or 312 increases to offset the decrease in the delay associated with the operation of the comparator 322 or 324 and the set/reset flip-flop 326. Thus, the relaxation oscillator 302 may provide output signals at a constant or nearly constant frequency in response to increases in the supply voltage.

In another example, when $V_{DD}$ decreases, the delay of the comparator 322 or 324 and/or the delay of the set/reset flip-flop 326 may increase, thus decreasing the frequency of the output signals of the relaxation oscillator 302. In response to the $V_{DD}$ decrease, the compensation current circuit 304 may provide $I_{COMPENSATION}$ to add to the value of $I_{BIAS}$ in order to increase $I_{RAMP}$ provided to the capacitor 310 or 312. By increasing $I_{RAMP}$, the time to charge the capacitor 310 or 312 increases in order to compensate for the increased delay in the operation of the comparator 322 or 324 and/or the increased delay of the set/reset flip-flop 326 in order to maintain providing the output signals of the relaxation oscillator 302 at a constant or nearly constant frequency.

Figure 4:
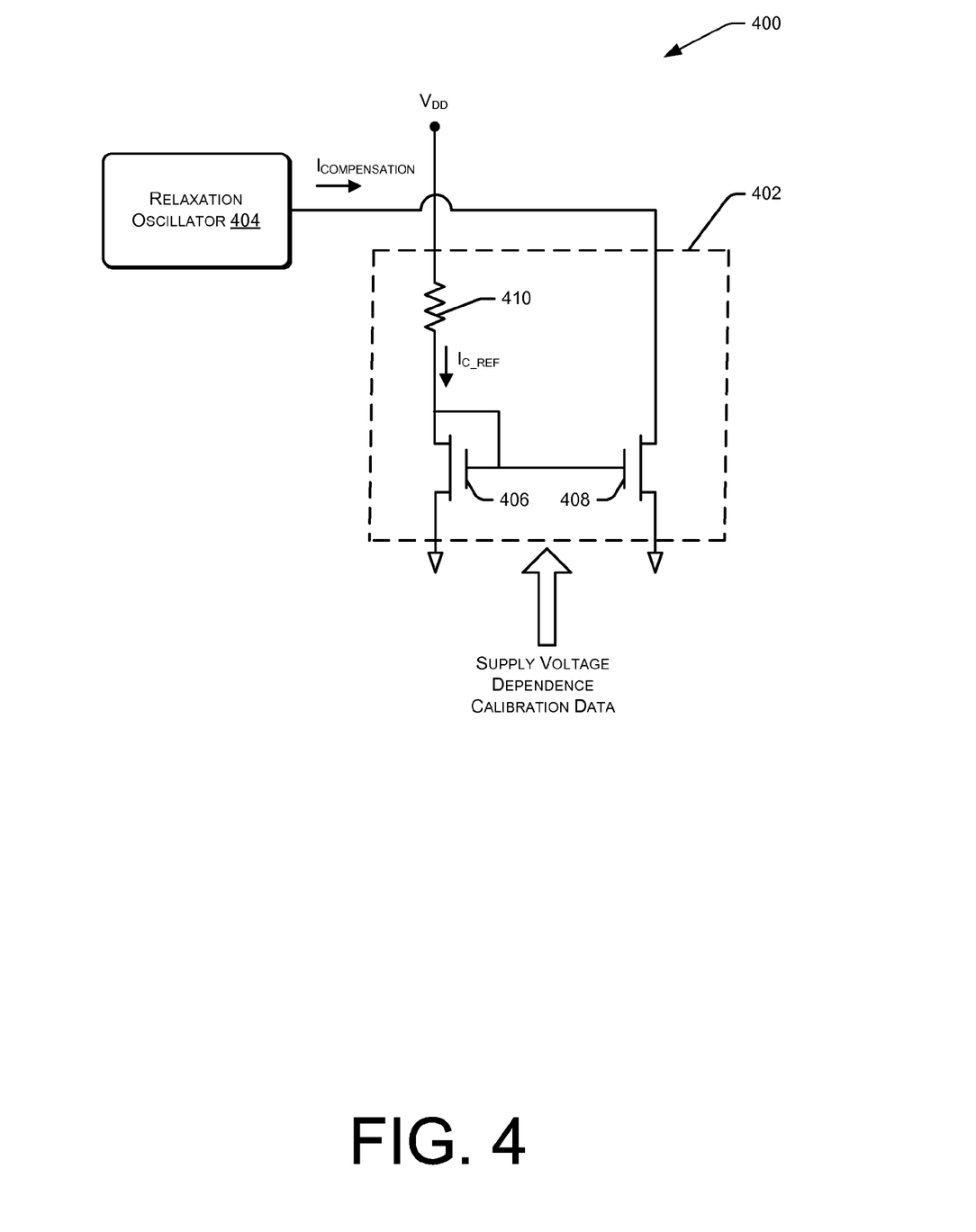
FIG. 4 is a schematic diagram of a system including a particular embodiment of a compensation current circuit coupled to a relaxation oscillator.

FIG. 4 is a schematic diagram of a system 400 including a particular embodiment of a compensation current circuit 402 coupled to a relaxation oscillator 404. The relaxation oscillator 404 may be implemented as the relaxation oscillator 102 of FIG. 1 or the relaxation oscillator 302 of FIG. 3, although other embodiments of relaxation oscillators may be used in conjunction with the compensation current circuit 402. The compensation current circuit 402 includes a current mirror arrangement with a first MOS transistor 406 and a second MOS transistor 408. Although the MOS transistors 406 and 408 are shown in FIG. 4 as n-type MOS (NMOS) transistors, the compensation current circuit 402 may also be implemented with one or more p-type MOS (PMOS) transistors.

In the particular embodiment shown in FIG. 4, the gate of the MOS transistor 406 is coupled to the gate of the MOS transistor 408. Additionally, the drain of the MOS transistor 406 is coupled to the gate of the MOS transistor 406 and also to an impedance device 410. In some cases, the impedance device 410 may include one or more resistors, one or more transistors, one or more capacitors, one or more inductors, and so on. The impedance device 410 is coupled to a source of a positive supply voltage $V_{DD}$. Further, a drain of the MOS transistor 408 is coupled to the relaxation oscillator 404. A current $I_{C\_REF}$ is provided to the drain of the MOS transistor 406, while a current $I_{COMPENSATION}$ is provided to the drain of the MOS transistor 408.

In an illustrative embodiment, when the supply voltage $V_{DD}$ increases, the current $I_{C\_REF}$ provided to the MOS transistor 406 also increases. The increase in the current $I_{C\_REF}$ is mirrored with respect to the MOS transistor 408 by increasing $I_{COMPENSATION}$ accordingly. In this way, current can be drawn away from the current provided to charge the energy storage devices of the relaxation oscillator 404. Consequently, the output signals of the relaxation oscillator 404 may be provided at or near a specified target frequency when the supply voltage changes because, as other components of the relaxation oscillator 404 operate at a higher speed due to the supply voltage increase, the time to charge energy storage devices of the relaxation oscillator 404 increases by a corresponding amount.

In another illustrative embodiment, when the supply voltage $V_{DD}$ decreases, the current $I_{C\_REF}$ provided to the MOS transistor 406 also decreases. The decrease in current $I_{C\_REF}$ provided to the MOS transistor 406 is mirrored with respect to the MOS transistor 408 by decreasing the value of $I_{COMPENSATION}$. Thus, less current is drawn away from the current provided to charge the energy storage devices of the relaxation oscillator 404 and the energy storage devices of the relaxation oscillator 404 can be charged at a faster rate. Accordingly, the decrease in the amount of time to charge the energy storage devices of the relaxation oscillator 404 compensates for the increased delay in the operation of other devices of the relaxation oscillators, such as voltage comparison devices, bi-stable state machines, and the like, in order to provide output signals at a constant or nearly constant frequency.

The compensation current circuit 402 may be digitally programmable to regulate the amount of current provided to the energy storage devices of the relaxation oscillator 404. In particular, supply voltage dependence calibration data may be provided to the compensation current circuit 402. The supply voltage dependence calibration data may be provided from storage devices, such as fuses, registers, and the like. In certain scenarios, a controller may provide the supply voltage dependence calibration data to the compensation current circuit 402. The supply voltage dependence calibration data may be utilized to adjust $I_{COMPENSATION}$ according to changes in $V_{DD}$ in order to provide output signals of the relaxation oscillator 404 at a constant or nearly constant frequency.

In some cases, the supply voltage dependence calibration data may include data that was stored during a wafer probing operation before the compensation current circuit 402 and the relaxation oscillator 404 were installed in a particular apparatus. In other cases, the supply voltage dependence calibration data may include data that was stored after installation of the compensation current circuit 402 and the relaxation oscillator 404 in a particular apparatus. To illustrate, the apparatus including the compensation current circuit 402 and the relaxation oscillator 404 may have a testing device that can generate supply voltage dependence calibration data for the compensation current circuit 402 periodically. For example, in some instances, the operational characteristics of the compensation current circuit 402 may change over time and the testing device may store new supply voltage dependence calibration data based on the changes in the operation of the compensation current circuit 402 in order to provide output signals for the relaxation oscillator 404 at a constant or nearly constant frequency.

Additionally, although features have been described in the illustrative embodiment of FIG. 4 as being connected to a source or drain of the respective MOS transistors 406, 408, these source or drain connections may be interchanged in other embodiments, such as when different types of MOS transistors are used and/or when the compensation current circuit is configured to modify current of a relaxation oscillator based on negative supply voltage changes. Thus, in an illustrative example, the MOS transistors 406, 408 may be PMOS transistors with the drain connection of the MOS transistor 406 coupled to a source of a negative supply voltage $V_{SS}$ and the MOS transistor 408 configured to provide $I_{COMPENSATION}$ that contributes to the discharge of energy storage devices of the relaxation oscillator 402.

Figure 5:
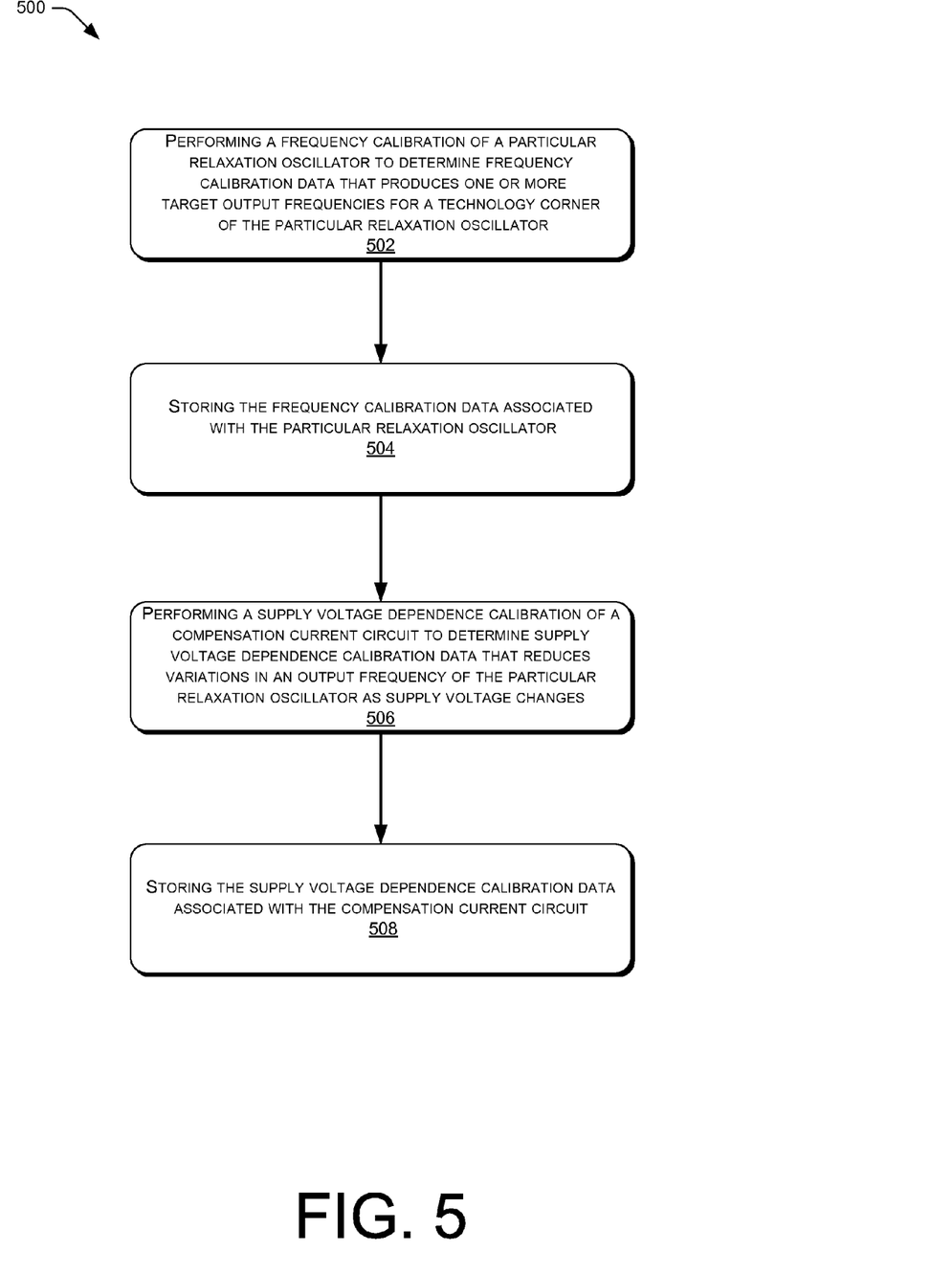
FIG. 5 is a flow diagram of a process to perform frequency calibration of a relaxation oscillator and perform a supply voltage dependence calibration of a compensation current circuit coupled to the relaxation oscillator.

FIG. 5 is a flow diagram of a process 500 to perform frequency calibration of a relaxation oscillator and perform a supply voltage dependence calibration of a compensation current circuit coupled to the relaxation oscillator. The process 500 is illustrated as a collection of blocks in a logical flow graph, which represent a sequence of operations that can be implemented in hardware, software, or a combination thereof. The order in which the operations are described is not intended to be construed as a limitation, and any number of the described blocks can be combined in any order and/or in parallel to implement the process.

At 502, a frequency calibration of a particular relaxation oscillator is performed. The particular relaxation oscillator may be one of a number of relaxation oscillators included on a particular substrate. The frequency calibration of the relaxation oscillator may take place via wafer probing by providing the substrate to a first testing device. The frequency calibration of the particular relaxation oscillator may determine frequency calibration data that is utilized to produce one or more target output frequencies of the particular relaxation oscillator. In addition, the frequency calibration data may be produced based on a technology corner of the particular relaxation oscillator. At 504, the frequency calibration data associated with the particular relaxation oscillator is stored in one or more data storage devices. For example, the frequency calibration data may be stored in one or more fuses, one or more registers, and the like.

At 506, a second testing device may perform a supply voltage dependence calibration of a compensation current circuit coupled to the relaxation oscillator. The compensation current circuit may be one of a number of compensation current circuits included on the substrate, with each compensation current circuit coupled to a respective relaxation oscillator. The supply voltage dependence calibration may take place via wafer probing by providing the substrate to a second testing device. The supply voltage dependence calibration may determine supply voltage dependence calibration data that is utilized to reduce variations in an output frequency of the particular relaxation oscillator as a supply voltage provided to the relaxation oscillator changes. In a particular embodiment, the supply voltage dependence calibration data may be utilized to modify a current provided to charge one or more capacitors of the particular relaxation oscillator by a specified amount when the supply voltage provided to the particular relaxation oscillator changes.

At 508, the supply voltage dependence calibration data associated with the compensation current circuit is stored in one or more data storage devices. In some cases, the supply voltage dependence calibration data may be stored in the same or similar data storage devices that store the frequency calibration data. Further, the supply voltage dependence calibration data and/or the frequency calibration data may be stored on computer memory storage devices to be used for quality control purposes or for other uses by the manufacturer of the relaxation oscillator and the compensation current circuit.

In some instances, the process 500 may be an iterative process with a plurality of frequency calibrations and/or a plurality of supply voltage dependence calibrations being performed with respect to the particular relaxation oscillator and/or the compensation current circuit by the first testing machine and the second testing machine. For example, after performing the supply voltage dependence calibration at 506, new frequency calibration data may need to be determined in order to achieve a particular target frequency for the relaxation oscillator. Therefore, an additional frequency calibration may be performed by the first testing device to produce additional frequency calibration data in order to achieve the particular target output frequency of the relaxation oscillator for the technology corner of the relaxation oscillator. Other supply voltage dependence calibrations and frequency calibrations may need to be performed by the first testing device and the second testing device to determine final versions of the frequency calibration data and the supply voltage dependence calibration data utilized to provide output signals for the relaxation oscillator at the particular target frequency.

Further, in some cases, one or more additional supply voltage dependence calibrations of the compensation current circuit may take place after installing an integrated circuit including the particular relaxation oscillator and the compensation current circuit in a particular apparatus. An additional supply voltage dependence calibration may determine additional supply voltage dependence calibration data that is different from the original supply voltage dependence calibration data. For example, in certain situations, the operation of the compensation current circuit may change over time. Thus, by determining additional supply voltage dependence calibration data, any changes to the operation of the compensation current circuit can be accounted for. Consequently, the compensation current provided by the compensation current circuit can still be effective in providing a constant or nearly constant output frequency of the particular relaxation oscillator as the operational characteristics of the compensation current circuit change. The additional supply voltage dependence calibration may be performed by an additional testing device that is coupled to the compensation current circuit. The additional testing device may be included on the same integrated circuit as the compensation current circuit. Additionally, the additional supply voltage dependence calibration data may be stored in one or more data storage devices accessible to the compensation current circuit.

For the purposes of this disclosure and the claims that follow, the terms "coupled" and "connected" have been used to describe how various elements interface. Such described interfacing of various elements may be either direct or indirect. Further, although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. An apparatus comprising:
  a relaxation oscillator including one or more capacitors; and
  a compensation current circuit coupled to the relaxation oscillator and configured to, based at least in part on a supply voltage calibration of the compensation current circuit, regulate current provided to the one or more capacitors of the relaxation oscillator in response to changes in a supply voltage provided to the compensation current circuit and to the relaxation oscillator, the supply voltage calibration of the compensation current circuit being provided from stored supply voltage calibration data.

2. The apparatus of claim 1, wherein the compensation current circuit comprises a current mirror arrangement including a first metal oxide semiconductor (MOS) transistor and a second MOS transistor, a gate of the first MOS transistor being coupled to a gate of the second MOS transistor, and a drain of the first MOS transistor being coupled to the gate of the first MOS transistor and an impedance device coupled to a supply voltage source.

3. The apparatus of claim 2 wherein a drain of the second MOS transistor is coupled to the relaxation oscillator.

4. The apparatus of claim 2, wherein the first MOS transistor and the second MOS transistor are n-type MOS (NMOS) transistors and the supply voltage is a positive supply voltage.

5. The apparatus of claim 4, wherein the compensation current circuit is configured to reduce an amount of current provided to the one or more capacitors when the supply voltage increases and the compensation current circuit is configured to increase the amount of current provided to the one or more capacitors when the supply voltage decreases.

6. The apparatus of claim 2, wherein the first MOS transistor and the second MOS transistor are p-type MOS (PMOS) transistors and the supply voltage is a negative supply voltage.

7. The apparatus of claim 1, wherein the compensation current circuit is digitally programmable to regulate the amount of current provided to the one or more capacitors.

8. A method comprising:
performing, by a first testing device, a frequency calibration of a particular relaxation oscillator to determine frequency calibration data that produces one or more target output frequencies of the particular relaxation oscillator for a technology corner of the particular relaxation oscillator;
storing the frequency calibration data associated with the particular relaxation oscillator;
performing, by a second testing device, a supply voltage dependence calibration of a compensation current circuit coupled to the particular relaxation oscillator, the supply voltage dependence calibration to determine supply voltage dependence calibration data that reduces variations in an output frequency of the particular relaxation oscillator as a supply voltage provided to the relaxation oscillator changes; and
storing the supply voltage dependence calibration data associated with the compensation current circuit.

9. The method of claim 8, further comprising performing at least one additional frequency calibration after the supply voltage dependence calibration to determine additional frequency calibration data that produces the one or more target output frequencies of the particular relaxation oscillator for the technology corner of the particular relaxation oscillator.

10. The method of claim 8, wherein the frequency calibration data and the supply voltage dependence calibration data are stored in one or more fuses, one or more registers, or both coupled to the particular relaxation oscillator and the compensation current circuit.

11. The method of claim 8, further comprising modifying a current provided to charge one or more capacitors of the particular relaxation oscillator by a specified amount based on the supply voltage dependence calibration data when the supply voltage provided to the particular relaxation oscillator changes.

12. The method of claim 8, further comprising:
installing an integrated circuit including the particular relaxation oscillator and the compensation current circuit in a particular apparatus;
performing an additional supply voltage dependence calibration with respect to the compensation current circuit after installing the integrated including the particular relaxation oscillator and the compensation current circuit, the additional supply voltage dependence calibration is performed to determine additional supply voltage dependence calibration data that reduces variations in the output frequency of the particular relaxation oscillator as the supply voltage provided to the particular relaxation oscillator changes; and
storing the additional supply voltage dependence calibration data, the additional supply voltage dependence calibration data being different from the supply voltage dependence calibration data.

13. The method of claim 12, wherein the integrated circuit includes an additional testing device that performs the additional supply voltage dependence calibration, and the additional testing device is coupled to the compensation current circuit.

14. The method of claim 8, further comprising:
providing a substrate including the particular relaxation oscillator and the compensation current circuit to the first testing device in order to perform the frequency calibration; and
providing the substrate to the second testing device in order to perform the supply voltage dependence calibration.

* * * * *